(12) United States Patent
Naijo

(10) Patent No.: US 9,577,220 B2
(45) Date of Patent: Feb. 21, 2017

(54) ORGANIC LIGHT EMITTING DIODE DISPLAY

(71) Applicant: SAMSUNG DISPLAY CO., LTD., Yongin, Gyeonggi-Do (KR)

(72) Inventor: Tsuyoshi Naijo, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 0 days.

(21) Appl. No.: 14/755,028

(22) Filed: Jun. 30, 2015

(65) Prior Publication Data

US 2016/0211484 A1   Jul. 21, 2016

(30) Foreign Application Priority Data

Jan. 15, 2015   (KR) .......................... 10-2015-0007614

(51) Int. Cl.
| H01L 51/52 | (2006.01) |
|---|---|
| H05B 33/04 | (2006.01) |
| H01L 27/32 | (2006.01) |
| H01L 51/00 | (2006.01) |

(52) U.S. Cl.
CPC ...... *H01L 51/5259* (2013.01); *H01L 27/3211* (2013.01); *H01L 27/3293* (2013.01); *H01L 51/0097* (2013.01); *H01L 51/5246* (2013.01); *H01L 2251/5338* (2013.01)

(58) Field of Classification Search
CPC .............. H01L 51/5259; H01L 27/3211; H01L 51/5246; H01L 27/3293
See application file for complete search history.

(56) References Cited

U.S. PATENT DOCUMENTS

| 8,508,432 | B2* | 8/2013 | Shim ..................... G06F 1/1601 345/1.1 |
|---|---|---|---|
| 2011/0121355 | A1* | 5/2011 | Bae ..................... H01L 51/5253 257/100 |
| 2014/0110726 | A1 | 4/2014 | Naijo |
| 2014/0117844 | A1* | 5/2014 | Naijo ..................... H05B 33/04 313/511 |
| 2014/0145161 | A1* | 5/2014 | Naijo ................. H01L 51/0097 257/40 |
| 2015/0062927 | A1* | 3/2015 | Hirakata ................. G09F 9/301 362/362 |

FOREIGN PATENT DOCUMENTS

| CN | 103779383 A | 5/2014 |
|---|---|---|
| JP | 2005-298598 A | 10/2005 |
| JP | 2009-095824 A | 5/2009 |
| JP | 2014-086720 A | 5/2014 |
| KR | 10-0637198 B1 | 10/2006 |
| KR | 10-0670343 B1 | 1/2007 |
| KR | 10-2014-0045193 A | 4/2014 |
| KR | 10-2014-0050927 A | 4/2014 |
| TW | 201417332 A | 5/2014 |

* cited by examiner

*Primary Examiner* — Donald Raleigh
(74) *Attorney, Agent, or Firm* — Lee & Morse P.C.

(57) ABSTRACT

An organic light emitting diode display includes a substrate including at least one folding part, two or more emission units parallel to each other and on a same surface of the substrate in an unfolded state of the substrate, the two or more emission units overlapping each other in a folded state of the substrate, and a moisture absorbent on an inner surface of the folding part.

20 Claims, 9 Drawing Sheets

ORGANIC LIGHT EMITTING DIODE DISPLAY

CROSS-REFERENCE TO RELATED APPLICATION

Korean Patent Application No. 10-2015-0007614, filed on Jan. 15, 2015, in the Korean Intellectual Property Office, and entitled: "Organic Light Emitting Diode Display," is incorporated by reference herein in its entirety.

BACKGROUND

1. Field

The described technology relates generally to an organic light emitting diode display, and more particularly, to a film-type organic light emitting diode display having high resolution.

2. Description of the Related Art

An organic light emitting diode display includes an organic light emitting diode disposed in each pixel on a substrate. The organic light emitting diode includes an emission layer, an anode for injecting holes into the emission layer, and a cathode for injecting electrons into the emission layer. The electrons and the holes are combined in the emission layer to generate excitons, and light is generated by energy generated when the excitons are dropped from an excited state to a ground state.

The organic light emitting diode display includes red pixels, green pixels, and blue pixels to implement a full-color image. The red pixel, the green pixel, and the blue pixel include a red emission layer, a green emission layer, and a blue emission layer, respectively.

SUMMARY

An exemplary embodiment provides an organic light emitting diode display, including a substrate including at least one folding part, two or more emission units parallel to each other and on a same surface of the substrate in an unfolded state of the substrate, the two or more emission units overlapping each other in a folded state of the substrate, and a moisture absorbent on an inner surface of the folding part.

The moisture absorbent may include at least two moisture absorbents.

The two or more emission units may include a plurality of pixels, the plurality of pixels being arranged to be offset from each other in a surface direction of the substrate in the folded state of the substrate.

A first emission unit of the two or more emission units may be a bottom emission type, and at least a second emission unit of the two or more emission units may be a top emission type.

Another exemplary embodiment provides an organic light emitting diode display, including a substrate including a first area and a second area connected to each other by a folding part, a first emission unit in the first area and including first pixels, a second emission unit in the second area and including second pixels, the second area facing the first emission unit in a folded state of the substrate, a moisture absorbent on an inner surface of the folding part, and a sealant to seal the first emission unit and the second emission unit, wherein the first pixels and the second pixels are offset from each other in a surface direction of the substrate in the folded state of the substrate.

Each of the first pixels and the second pixels may include a red pixel, a green pixel, and a blue pixel arranged at a first pitch, and a pixel pitch of a display surface of the first pixels and the second pixels in the folded state of the substrate may be a half of the first pitch.

An arrangement order of the first pixels in one direction of the display surface in an unfolded state of the substrate may be different from an arrangement order of the second pixels.

Each of the first pixels may include a transparent first pixel electrode, a first emission layer, and a metal first common electrode, and in the first emission unit, the first common electrode may include a plurality of electrode units and a wiring unit for connecting the plurality of electrode units.

Each of the second pixels may include a metal second pixel electrode, a second emission layer, and a transparent second common electrode.

The moisture absorbent may include at least two moisture absorbents.

Another exemplary embodiment provides an organic light emitting diode display, including a substrate including a third area, a fourth area connected a first side of the third area by a first folding part, and a fifth area connected to a second side of the third area by a second folding part, a third emission unit in the third area and including third pixels, a fourth emission unit in the fourth area and including fourth pixels, a fifth emission unit in the fifth area and including fifth pixels, moisture absorbents on internal surfaces of the first folding part and the second folding part, and a sealant to seal the third to fifth emission units, wherein the third emission unit, the fourth emission unit. and the fifth emission unit overlap each other in a folded state of the substrate, and the third pixels, the fourth pixels, and the fifth pixels are offset from each other in a surface direction of the substrate in a folded state of the substrate.

Each of the third pixels, the fourth pixels, and the fifth pixels may include a red pixel, a green pixel, and a blue pixel.

Each of the third pixels, the fourth pixels, and the fifth pixels may include an emission layer of a single color arranged at a second pitch, and a pixel pitch of a display surface defined by the third pixels, the fourth pixels, and the fifth pixels may be ⅓ of the second pitch.

Each of the third pixels may include a transparent third pixel electrode, a third emission layer, and a metal third common electrode, and in the third emission unit, the metal third common electrode may include a plurality of electrode units and a wiring unit for connecting the plurality of electrode units.

Each of the fourth pixels may include a metal fourth pixel electrode, a fourth emission layer, and a transparent fourth common electrode, and each of the fifth pixels may include a metal fifth pixel electrode, a fifth emission layer, and a transparent fifth common electrode.

The moisture absorbent may include at least two moisture absorbents.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
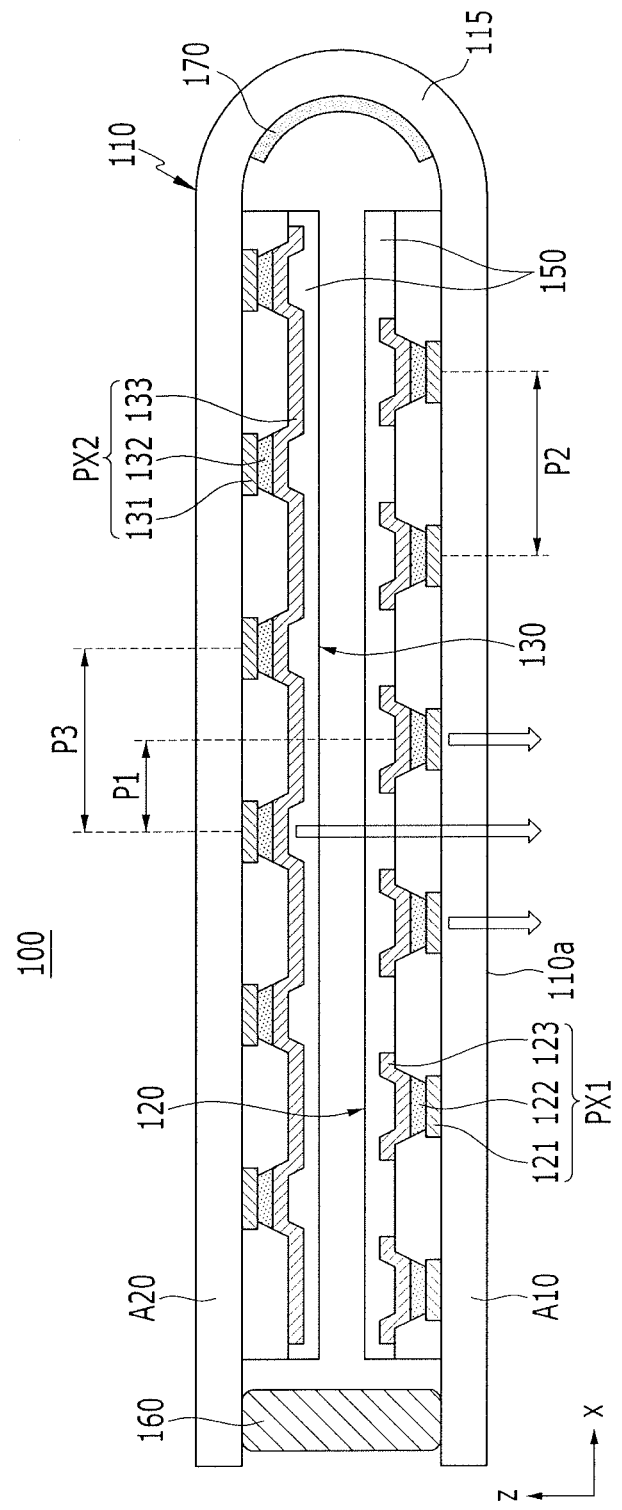
FIG. 1 illustrates a cross-sectional view of an organic light emitting diode display according to a first exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Further, the word "on" means positioning on or below the object portion, but does not essentially mean positioning on the upper side of the object portion based on a gravity direction. Like reference numerals refer to like elements throughout.

Unless explicitly described to the contrary, the word "comprise" and variations such as "comprises" or "comprising", will be understood to imply the inclusion of stated elements but not the exclusion of any other elements.

Figure 2:
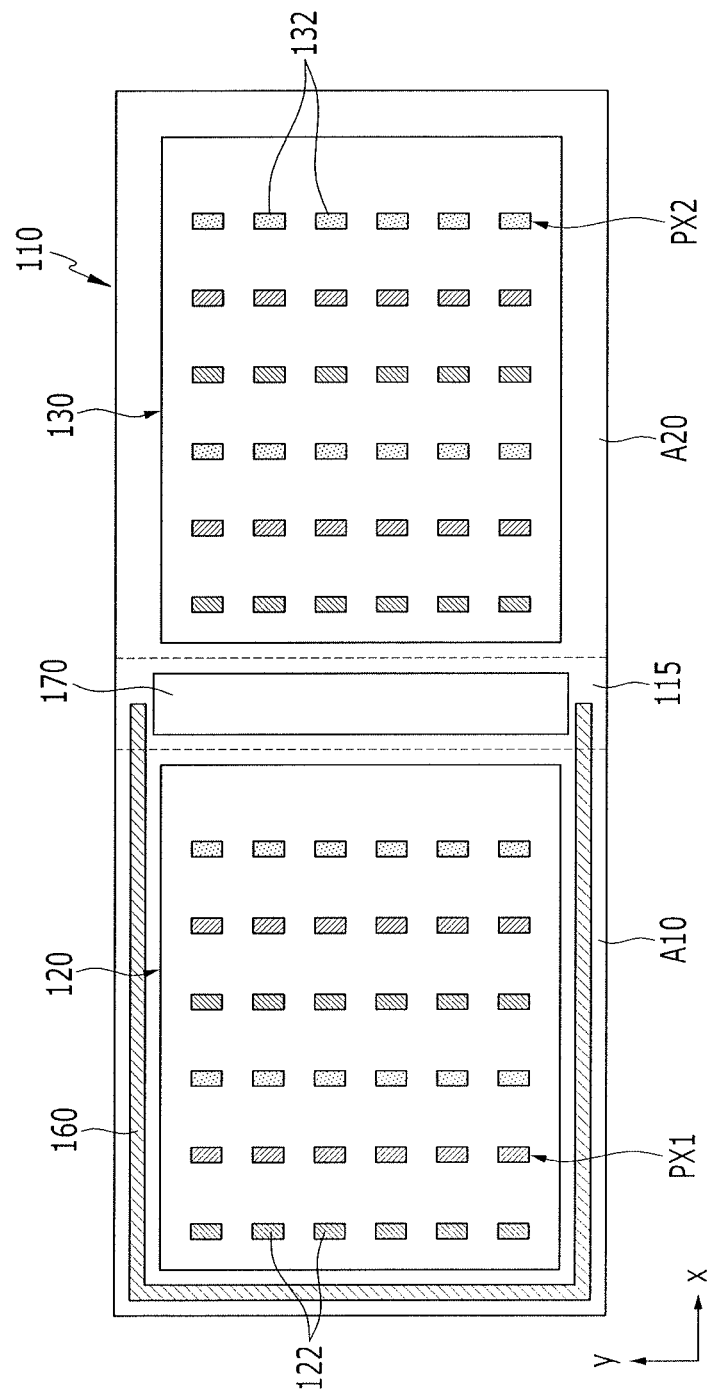
FIG. 2 illustrates a schematic top plan view of an unfolded state of the organic light emitting diode display illustrated in FIG. 1.

FIG. 1 illustrates a cross-sectional view of an organic light emitting diode display according to a first exemplary embodiment, and FIG. 2 is a schematic top plan view of an unfolded state of the organic light emitting diode display illustrated in FIG. 1.

Referring to FIGS. 1 and 2, an organic light emitting diode display 100 according to a first exemplary embodiment includes a substrate 110 having a folding part 115, and a first emission unit 120 and a second emission unit 130 which are formed on one surface of the substrate 110 and overlap each other by folding of the substrate 110.

The substrate 110 may have a transparent and bending property, and may be formed of, e.g., a transparent polymer film. The substrate 110 may bend only at the folding part 115. That is, as illustrated in FIG. 2, the substrate 110 includes a first area A10 and a second area A20 spaced apart from each other in a surface direction, e.g., along the x-axis, when the substrate 110 is in an unfolded state, and the folding part 115 is disposed between the first area A10 and the second area A20, e.g., along the x-axis.

The first emission unit 120 is formed in the first area A10 and the second emission unit 130 is formed in the second area A20. Further, when the substrate 110 is in the unfolded state, the first emission unit 120 and the second emission unit 130 are formed in parallel on one surface of the substrate 110, e.g., on a same surface of the substrate 110, and a plurality of signal lines is formed over the first emission unit 120, the folding part 115, and the second emission unit 130 on one surface of the substrate 110.

The first emission unit 120 and the second emission unit 130 include a plurality of first pixels PX1 and a plurality of second pixels PX2, respectively, arranged in a row direction (x-axis direction) and a column direction (y-axis direction), respectively. The plurality of first pixels PX1 and the plurality of second pixels PX2 include red pixels, green pixels, and blue pixels. In all of the first emission unit 120 and the second emission unit 130, the pixels with a same color may be arranged in parallel in the column direction, and pixels with different colors may be alternately arranged in the row direction.

An arrangement order of the first pixels PX1 in the row direction in the unfolded state of the substrate 110 is different from that of the second pixels PX2. For example, the first pixels PX1 may be arranged in an order of the blue pixel, the red pixel, and the green pixel, and the second pixels PX2 may be arranged in an order of the red pixel, the blue pixel, and the green pixel.

The first emission unit 120 may be configured by a bottom emission type, which emits light toward the substrate 110, and the second emission unit 130 may be configured by a top emission type, which emits light toward an opposite side of the substrate 110, i.e., away from the substrate 110.

As illustrated in FIG. 1, each of the first pixels PX1 of the first emission unit 120 includes a first pixel electrode 121, a first emission layer 122, and a first common electrode 123 on a first surface of the substrate 110. The first pixel electrode 121 may be formed of a transparent conductive layer, e.g., indium tin oxide (ITO), and the first common electrode 123 may be formed of metal. Light emitted from the first emission layer 122 is reflected from the first common electrode 123 back toward the first emission layer 122, and passes through the first pixel electrode 121 and the substrate 110.

As further illustrated in FIG. 1, each of the second pixels PX2 of the second emission unit 130 includes a second pixel electrode 131, a second emission layer 132, and a second common electrode 133 on the first surface of the substrate 110. The second pixel electrode 131 may be formed of metal, and the second common electrode 133 may be formed of a transparent conductive layer. Light emitted from the second emission layer 132 is reflected from the second pixel electrode 131 toward the second common electrode 133, and passes through the second common electrode 133.

In this case, a transparent buffer layer 150 is formed on the entire first emission unit 120 and second emission unit 130 to cover and protect the first pixels PX1 and the second pixels PX2. The transparent buffer layer 150 may be formed of an inorganic material, e.g., silicon oxide, or an organic material, e.g., polyimide.

Any one of the first pixel electrode 121 and the first common electrode 123 may serve as the anode for injecting holes into the first emission layer 122, and the other one may serve as the cathode for injecting electrons into the first emission layer 122. When the first pixel electrode 121 serves as the anode, the second pixel electrode 131 also serves as the anode.

An up and down position relation of the second emission unit 130, which is configured as the top emission type in the unfolded state of the substrate 110, is reversed due to the folding of the substrate 110, so that the second emission unit 130 emits light in the same direction as that of the first emission unit 120. The light of the first emission unit 120 and the light of the second emission unit 130 in the folded state of the substrate 110 are directed in a downward direction based on FIG. 1.

A display surface 110*a* of the organic light emitting diode display 100 is defined as an external surface of the substrate 110 on which the first emission unit 120 is formed, e.g., a most external surface of the substrate 110 through which light is emitted to display an image in a folded state of the substrate 100. The light of the first emission unit 120 passes through the substrate 110 to be emitted to the display surface, and the light of the second emission unit 130 passes through the first emission unit 120 and the substrate 110 to be emitted to the display surface.

The first pixels PX1 and the second pixels PX2 are spaced apart from each other in the row direction (x-axis direction) of the display surface in the folded state of the substrate 110, so that the first pixels PX1 and the second pixels PX2 do not overlap each other in a thickness direction (an z-axis direction) of the organic light emitting diode display 100. That is, the first pixels PX1 are positioned to be inconsistent, e.g., misaligned, with the second pixels PX2 in the row direction, so the light emitted from the second pixels PX2 is not mixed with the light emitted from the first pixels PX1. For example, the first pixels PX1 and the second pixels PX2 are offset from each other along the x-axis in a zigzag structure, such that light emitted from each second pixel PX2 passes in a space between two first pixels PX1 adjacent to each other along the x-axis.

The first emission unit 120 includes the first common electrode 123 formed of metal. If the first common electrode 123 were to be formed in the entire first emission unit 120, light of the second emission unit 130 would fail to pass through the first emission unit 120. Therefore, the first common electrode 123 includes a plurality of electrodes spaced apart from each other, as will be described in more detail below with reference to FIG. 3.

Figure 3:
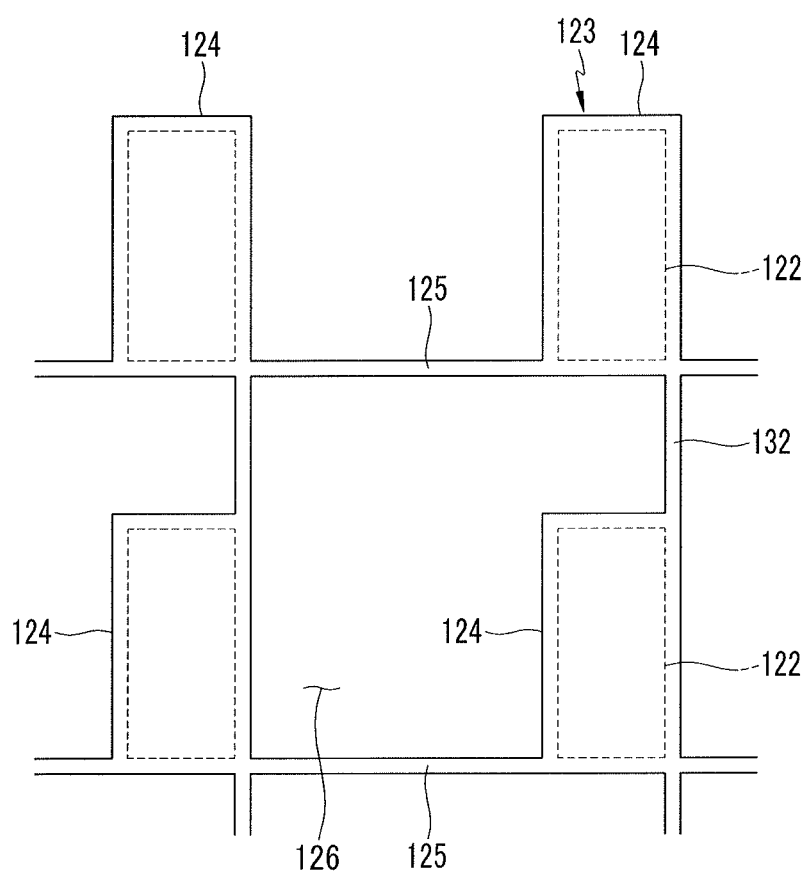
FIG. 3 illustrates a top plan view of a first common electrode in the organic light emitting diode display illustrated in FIG. 1.

FIG. 3 is a top plan view of the first common electrode 123.

Referring to FIG. 3, the first common electrode 123 may include a plurality of electrode units 124 positioned while being spaced apart from each other, and a wiring unit 125 for connecting the plurality of electrode units 124 and allowing an electric current to be applied to the plurality of electrode units 124. Each electrode unit 124 may be formed to be slightly larger than a corresponding first emission layer 122 on the first emission layer 122. An opening area 126 is formed between adjacent electrode units 124, so that light emitted from the second emission unit 130 passes through the first emission unit 120 via the opening region 126.

Referring back to FIGS. 1 and 2, the organic light emitting diode display 100 includes a sealant 160 and a moisture absorbent 170. The sealant 160 fixes the folded state of the substrate 110, e.g., connects edges of the folded substrate 110, and serves to prevent external air from flowing into the first emission unit 120 and the second emission unit 130. For example, as illustrated in FIG. 2, the sealant 160 may be formed at a part of the first area A10 and the folding part 115 in the unfolded state of the substrate 110. For example, the sealant 160 may be formed at three edges, except for one edge facing the folding part 115, among four edges of the first area A10 surrounding the first emission unit 120. Further, both ends of the sealant 160 may be extended up to a center of an upper end and a center of a lower end of the folding part 115.

When the substrate 110 is folded, i.e., with the sealant 160 on the first area A10, the second area A20 folds over the first area A10 to cover the first area A10 and to contact a top of the sealant 160. The sealant 160 is melted at a high temperature, so that an edge of the first area A10 and an edge of the second area A20 are integrally bonded by the melted sealant 160. Through the sealing structure, it is possible to prevent moisture and oxygen in external air from permeating into the first emission unit 120 and the second emission unit 130.

The moisture absorbent 170 is formed on an internal surface of the folding part 115. After the aforementioned first emission unit 120 and second emission unit 130 are formed on the substrate 110, and before the sealant 160 is applied, a sheet-type moisture absorbent may be attached to a part corresponding to the folding part 115 or a liquid moisture absorbent may be applied by moving the substrate 110 to a glove box having a nitrogen atmosphere. The moisture absorbent 170 may include, e.g., a barium oxide, a calcium oxide, or the like.

The folding part 115 makes the first emission unit 120 and the second emission unit 130 overlap in the organic light emitting diode display 100, and is positioned at an outer side of the display surface. As illustrated in FIG. 2, the moisture absorbent 170 is formed on the internal surface of the folding part 115, i.e., between the first and second emission units 120 and 130, without overlapping the first and second emission units 120 and 130. Accordingly, it is not necessary to expand the dead space at the outer side of the display surface in order to form the moisture absorbent 170, and it is possible to easily dispose the moisture absorbent 170 inside the organic light emitting diode display 100.

The moisture absorbent 170 absorbs moisture and substance gas by outgassing generated inside the organic light emitting diode display 100, after the organic light emitting diode display 100 is sealed by the sealant 160, to restrict deterioration of the organic light emitting diode. Accordingly, it is possible to improve durability and screen, e.g., display, quality of the organic light emitting diode display 100 of the first exemplary embodiment.

In the above description, the "pixel" is used as a meaning including the organic light emitting diode display including the pixel circuit including a thin film transistor and a capacitor, the anode, the emission layer, and the cathode.

In the organic light emitting diode display 100 of the first exemplary embodiment, the substrate is divided into the two areas A10 and A20, and the first pixels PX1 and the second pixels PX2 are divided and formed in the two areas A10 and A20. Further, the first pixels PX1 and the second pixels PX2 are stacked by folding the substrate 110, and are spaced apart from each other in the row direction (x-axis direction) of the display surface.

In FIG. 1, pitch (distances between the centers of the pixels PX1 and PX2) of the all pixels PX1 and PX2 configuring the display surface are illustrated by P1. Pitch P2 of the first pixels PX1 is two times of the pitch P1 of the entire pixels, and pitch P3 of the second pixels is also two times of the pitch P1 of the entire pixels.

In FIG. 1, a pixel pitch of the display surface (a distance between the centers of the pixels) is illustrated by P1. The pitch P2 of the first pixels PX1 is two times of the pixel pitch P1, and the pitch P3 of the second pixels PX2 is also two times of the pixel pitch P1.

Accordingly, when the first emission layer 122 of the first pixels PX1 and the second emission layer 132 of the second pixels PX2 are formed by a vacuum deposition method, it is not necessary to use a high accuracy deposition mask in which a distance between deposition openings is very small, so that it is possible to easily manufacture the first and second emission units 120 and 130. Further, the pitch of the first and second pixels PX1 and PX2 is increased, so that even though a slight error is generated in the alignment of the substrate 110 and the deposition mask, there is no concern in that the emission layer having a specific color invades, e.g., overlaps, the emission layer having another color.

Accordingly, in the organic light emitting diode display 100 of the first exemplary embodiment, the pixel pitch P1 of the display surface may be formed to be very small without a concern of the mixing of the colors, thereby implementing a screen with high resolution. Further, the moisture absorbent 170 may be disposed inside the organic light emitting diode display 100, even without expanding the dead area, thereby maximally restricting deterioration of the organic light emitting diode.

Figure 4:
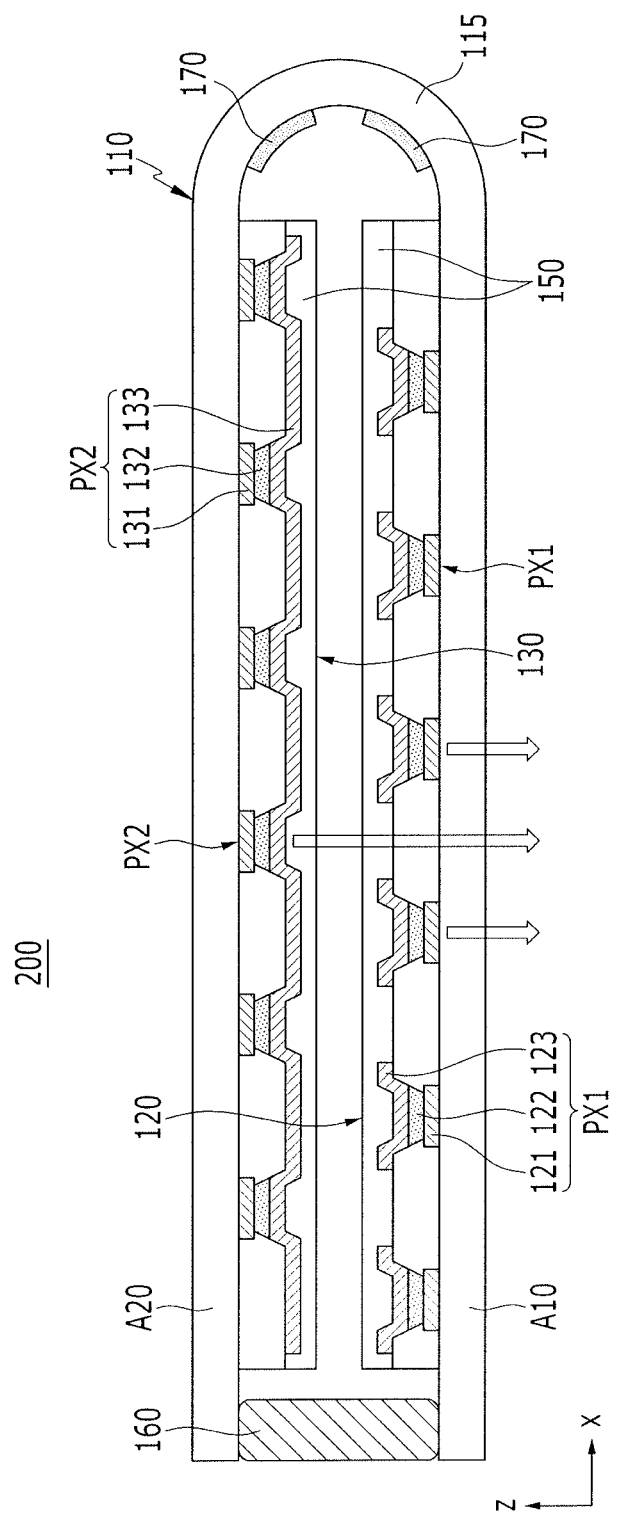
FIG. 4 illustrates a cross-sectional view of an organic light emitting diode display according to a second exemplary embodiment.
Figure 5:
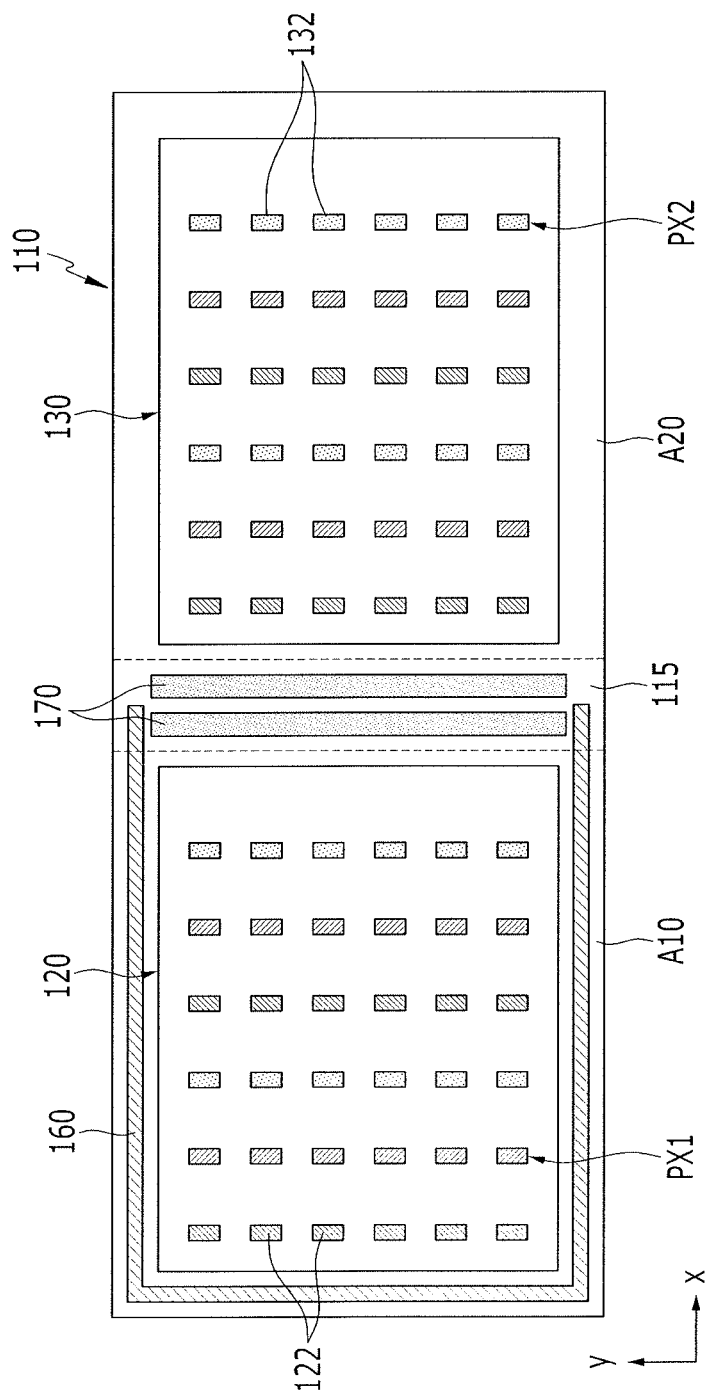
FIG. 5 illustrates a schematic top plan view of an unfolded state of the organic light emitting diode display illustrated in FIG. 4.

FIG. 4 illustrates a cross-sectional view of an organic light emitting diode display according to a second exemplary embodiment. FIG. 5 is a schematic top plan view of an unfolded state of the organic light emitting diode display illustrated in FIG. 4.

Referring to FIGS. 4 and 5, an organic light emitting diode display 200 according to a second exemplary embodiment includes the same configuration as that of the aforementioned first exemplary embodiment, except that a moisture absorbent 170 is divided into at least two moisture absorbents. The same members as those of the first exemplary embodiment are denoted by the same reference numerals, and different parts from those of the first exemplary embodiment will be mainly described below.

The moisture absorbent 170 is formed of a thin film, but when the folding part 115 is bent, the folding part 115 and the moisture absorbent 170 may interfere with each other. When the moisture absorbent 170 is separated into a plurality of moisture absorbents 170, it is possible to decrease mutual interference between the folding part 115 and the moisture absorbent 170, thereby minimizing damage to the moisture absorbent 170 or the folding part 115. FIGS. 4 and 5 illustrate the two divided moisture absorbents 170 as an example.

Figure 6:
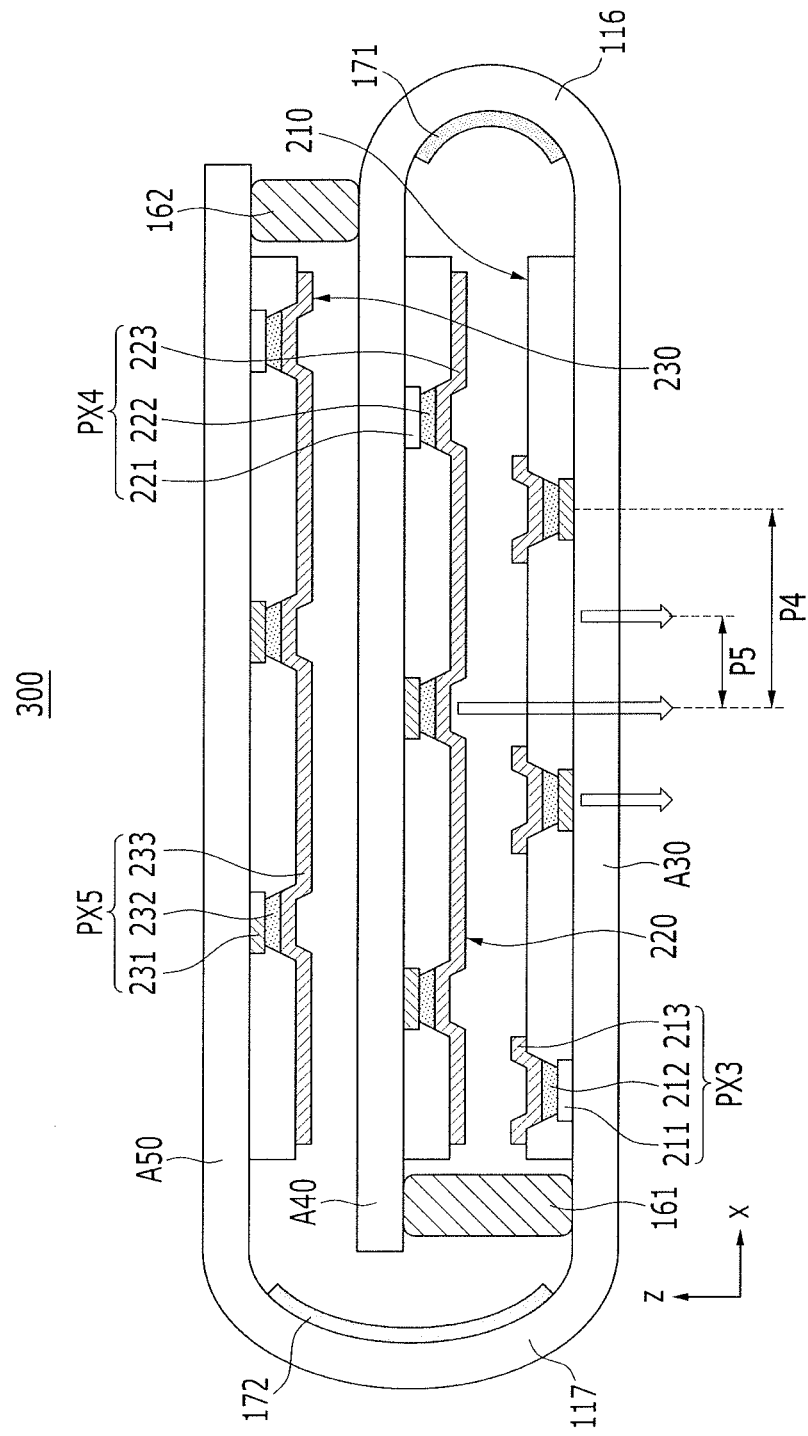
FIG. 6 illustrates a cross-sectional view of an organic light emitting diode display according to a third exemplary embodiment.
Figure 7:
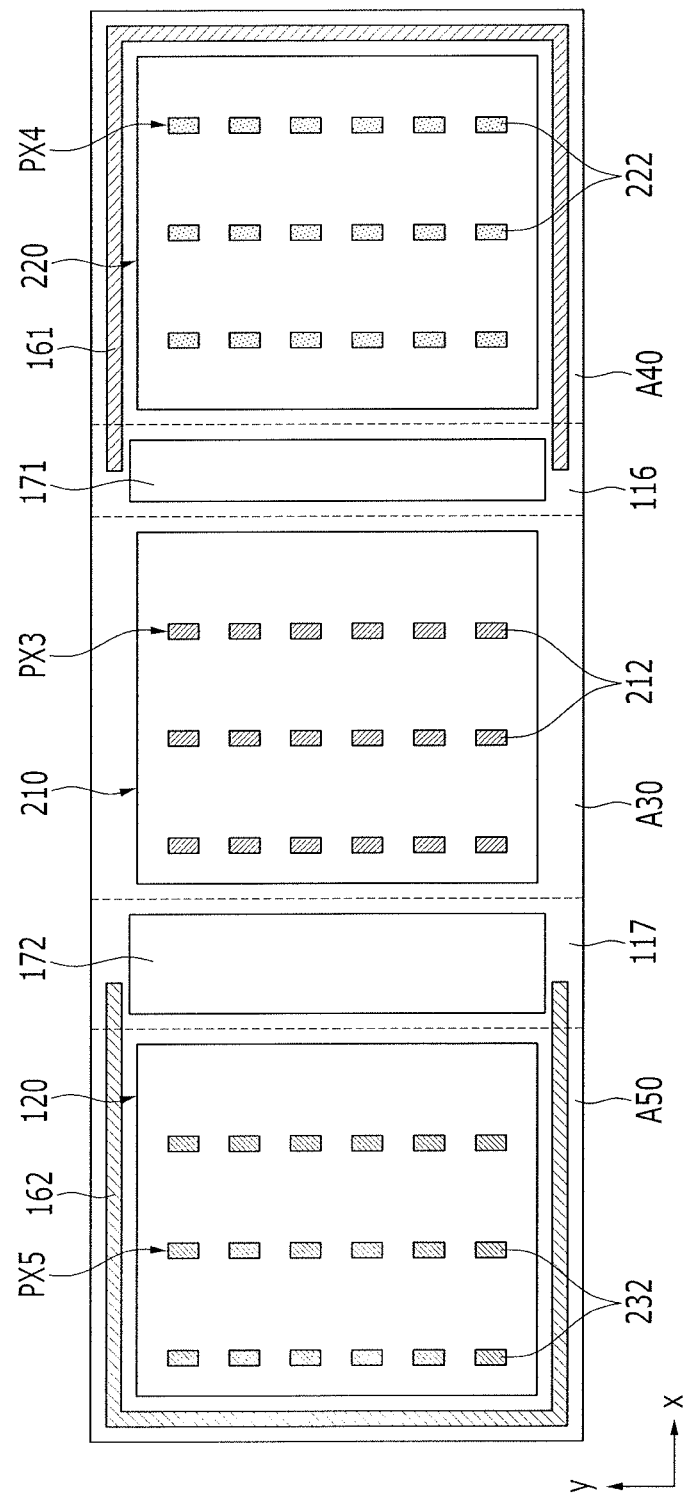
FIG. 7 illustrates a schematic top plan view of an unfolded state of the organic light emitting diode display illustrated in FIG. 6.

FIG. 6 illustrates a cross-sectional view of an organic light emitting diode display according to a third exemplary embodiment. FIG. 7 is a schematic top plan view illustrating an unfolded state of the organic light emitting diode display illustrated in FIG. 6.

Referring to FIGS. 6 and 7, an organic light emitting diode display 300 according to a third exemplary embodiment includes the substrate 110 including two folding parts 116 and 117, and a third emission unit 210, a fourth emission unit 220, and a fifth emission unit 230 which are formed on one surface of the substrate 110 and mutually overlap by the folding of the substrate 110. Each of the third emission unit 210, the fourth emission unit 220, and the fifth emission unit 230 emits light of any one of red, green, and blue, and a color image is implemented by a combination of three light emission colors.

The substrate 110 includes a third area A30, and a fourth area A40 with a fifth area A50 positioned at both sides of the third area A30 in an unfolded state thereof (FIG. 7). The first folding part 116 is positioned between the third area A30 and the fourth area A40, and the second folding part 117 is positioned between the third area A30 and the fifth area A50. The third emission unit 210, the fourth emission unit 220, and the fifth emission unit 230 are formed in the third region A30, the fourth region A40, and the fifth region A50, respectively.

The third emission unit 210 includes third pixels PX3, the fourth emission unit 220 includes fourth pixels PX4, and the fifth emission unit 230 includes fifth pixels PX5. The third pixels PX3, the fourth pixels PX4, and the fifth pixels PX5 are one pixel, another pixel, and the remaining pixel among a red pixel, a green pixel, and a blue pixel, respectively.

The third emission unit 210 is configured by a bottom emission type for emitting light toward the substrate 110 in the unfolded state of the substrate 110, and the fourth emission unit 220 and the fifth emission unit 230 are configured by a top emission type for emitting light toward an opposite side of the substrate 110.

The third pixels PX3 of the third emission unit 210 includes a third pixel electrode 211, a third emission layer 212, and a third common electrode 213. The third pixel electrode 211 may be formed of a transparent conductive layer, and the third common electrode 213 may be formed of metal. Light emitted from the third emission layer 212 is reflected from the third common electrode 213, and passes through the third pixel electrode 211 and the substrate 110. The third common electrode 213 may include a plurality of electrode units, and a wiring unit for connecting the plurality of electrode units and allowing an electric current to be applied to the plurality of electrode units similar to the aforementioned first common electrode of the first exemplary embodiment.

The fourth pixel PX4 of the fourth emission unit 220 includes a fourth pixel electrode 221, a fourth emission layer 222, and a fourth common electrode 223. The fourth pixel electrode 221 may be formed of metal, and the fourth common electrode 223 may be formed of a transparent conductive layer. Light emitted from the fourth emission layer 222 is reflected from the fourth pixel electrode 221, and passes through the fourth common electrode 223.

The fifth pixel PX5 of the fifth emission unit 230 includes a fifth pixel electrode 231, a fifth emission layer 232, and a fifth common electrode 233. The fifth pixel electrode 231 may be formed of metal, and the fifth common electrode 223 may be formed of a transparent conductive layer. Light emitted from the fifth emission layer 232 is reflected from the fifth pixel electrode 231, and passes through the fourth common electrode 233.

In this case, a transparent buffer layer (not illustrated) may be formed on the entire third emission unit 210, fourth emission unit 220, and fifth emission unit 230 to cover and protect the third pixel PX3, the fourth pixel PX4, and the fifth pixel PX5.

The substrate 110 is folded so that the fourth emission unit 220 faces the third emission unit 210 by the bending of the first folding part 116, and the fifth emission unit 230 faces the third emission unit 210 by the ending of the second folding part 117. In the state where the substrate 110 is folded, the fifth emission unit 230 faces the third emission unit 210 with the fourth emission unit 220 interposed therebetween.

Up and down position relations of the fourth emission unit 220 and the fifth emission unit 230 configured by the top emission type in the state where the substrate 110 is unfolded are reversed by the folding of the substrate 110, so that the fourth emission unit 220 and the fifth emission unit 230 emit light in the same direction as that of the third emission unit 210. The light of the third emission unit 210 passes through the substrate 110 and is emitted to a display surface, and the light of the fourth emission unit 220 passes through the third emission unit 210 and the substrate 110 to be emitted to the display surface. The light of the fifth emission unit 230 passes through the fourth emission unit 220, the third emission unit 210, and the substrate 110 to be emitted to the display surface.

The third pixels PX3, the fourth pixels PX4, and the fifth pixels PX5 are spaced apart from each other in the row direction (x-axis direction) of the display surface in the folded state of the substrate 110, so that the third pixels PX3, the fourth pixels PX4, and the fifth pixels PX5 do not overlap each other in a thickness direction (an z-axis direction) of the organic light emitting diode display 200. That is, the third pixels PX3, the fourth pixels PX4, and the fifth pixels PX5 are located to be inconsistent with each other in the row direction, and the light emitted from fourth pixels PX4 and the fifth pixels PX5 is not mixed with the light emitted from the third pixels PX3.

Each of the third to fifth emission units 210, 220, and 230 includes an emission layer of a single color, so that when the third to fifth emission layers 212, 222, and 232 are formed by a vacuum deposition method, there is no concern in that the emission layer having a specific layer invades the emission layer having another color. Further, a pitch P4 of each of the third pixel PX3, the fourth pixel P4, and the fifth pixel PX5 is three times of a pixel pitch P5 of the display surface, so that it is not necessary to use a high accuracy deposition mask. Accordingly, it is possible to easily manufacture the third to fifth emission units 210, 220, and 230.

The organic light emitting diode display 300 of the third exemplary embodiment includes two sealants 161 and 162, and two moisture absorbents 171 and 172. The first sealant 161 may be formed in a part of the fourth area A40 and a first folding part 116 in an unfolded state of the substrate 110. The second sealant 162 may be formed in a part of the fifth area A50 and a second folding part 117 in the unfolded state of the substrate 110.

The substrate 110 is folded two times in a state where the first and second sealants 161 and 162 are applied, and the first and second sealants 161 and 162 are melted at a high temperature, so that the folded substrate 110 is integrally bonded.

The first moisture absorbent 171 is formed on an internal surface of the first folding part 116, and the second moisture absorbent 172 is formed on an internal surface of the second folding part 117. The first and second moisture absorbents 171 and 172 do not invade the third to fifth emission units 210, 220, and 230, and do not cause an expansion of a dead space. The organic light emitting diode display 300 of the third exemplary embodiment may restrict deterioration of an organic light emitting diode and improve durability and a quality of a product by using the first and second moisture absorbents 171 and 172.

Figure 8:
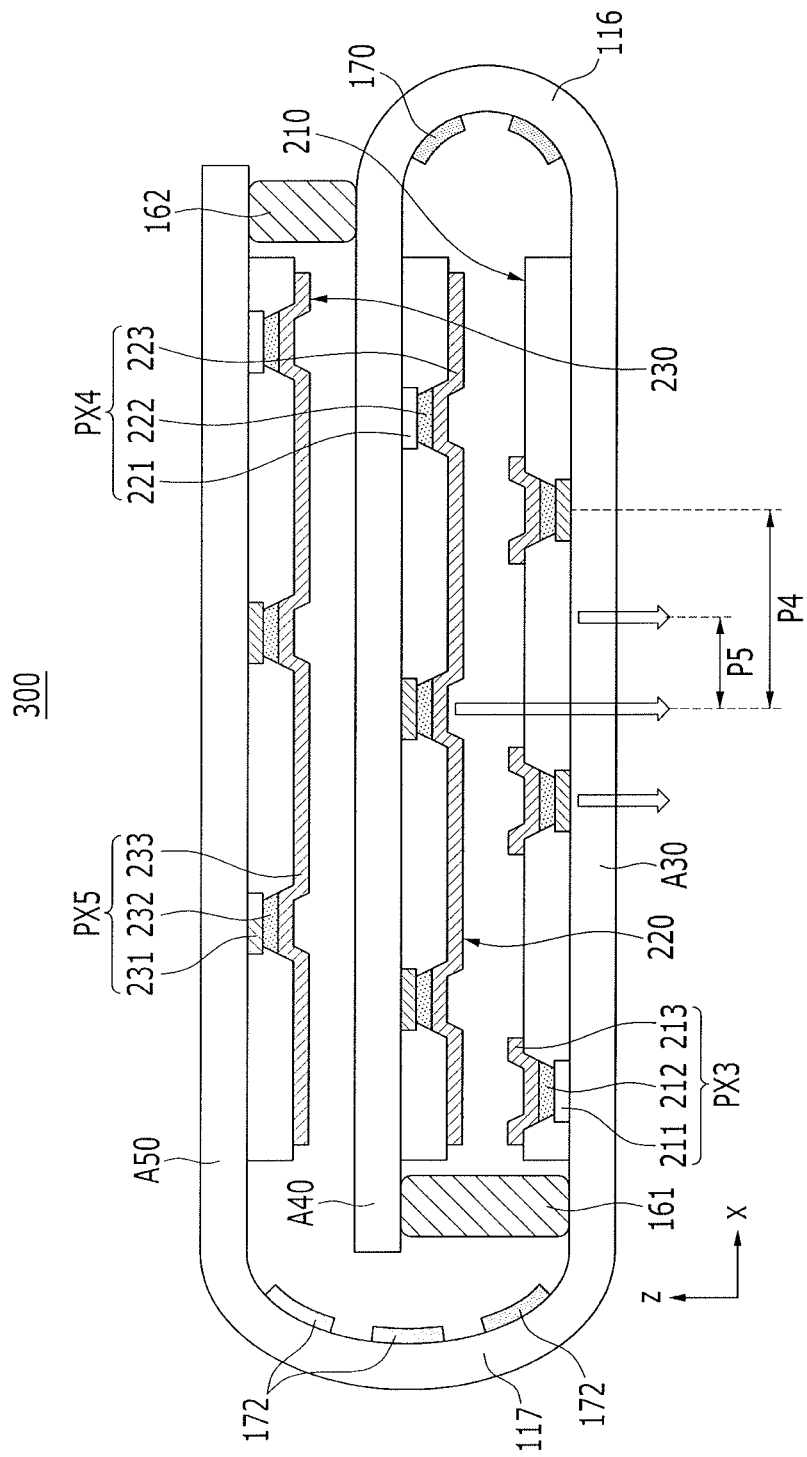
FIG. 8 illustrates a cross-sectional view of an organic light emitting diode display according to a fourth exemplary embodiment.
Figure 9:
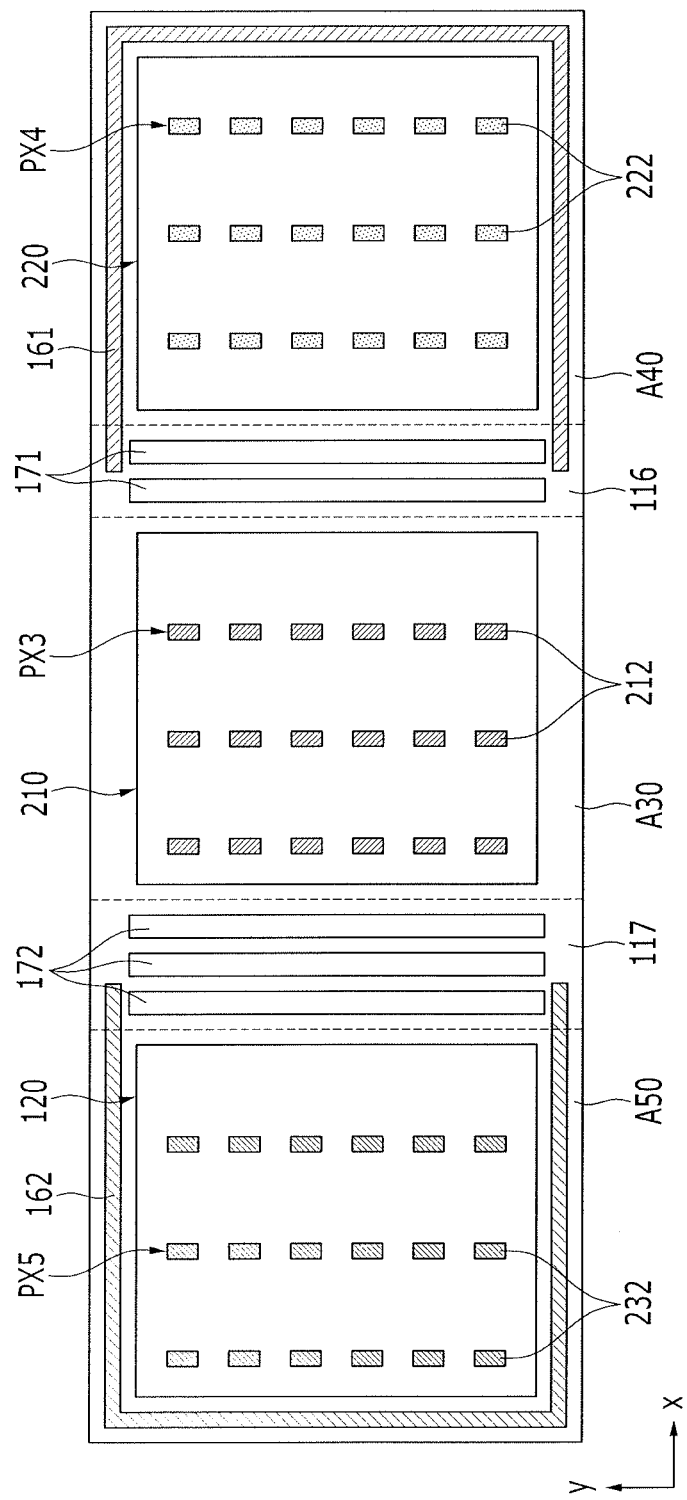
FIG. 9 illustrates a schematic top plan view of an unfolded state of the organic light emitting diode display illustrated in FIG. 8.

FIG. 8 illustrates a cross-sectional view of an organic light emitting diode display according to a fourth exemplary embodiment. FIG. 9 illustrates a schematic top plan view illustrating an unfolded state of the organic light emitting diode display illustrated in FIG. 8.

Referring to FIGS. 8 and 9, an organic light emitting diode display 400 according to a fourth exemplary embodiment includes the same configuration as that of the aforementioned third exemplary embodiment, except that each of the first and second moisture absorbents 171 and 172 is divided into at least two moisture absorbents. The same member as that of the third exemplary embodiment is denoted by the same reference numeral, and different parts from those of the third exemplary embodiment will be mainly described below.

The first and second moisture absorbents 171 and 172 may be formed of thin films, but when first and second folding parts 116 and 117 are bent, the first and second folding parts 116 and 117 may interfere with the first and second moisture absorbents 171 and 172.

The plurality of first moisture absorbents 171 and the plurality of second moisture absorbents 172 are separately formed, so that it is possible to minimize a damage of the first and second moisture absorbents 171 and 172 or the first and second folding parts 116 and 117 by decreasing an interference of the first and second folding parts 116 and 117 and the first and second moisture absorbents 171 and 172. FIGS. 10 and 11 illustrate the two separately formed first moisture absorbents 171 and the three separately formed second moisture absorbents 172 as an example.

By way of summation and review, the red emission layer, the green emission layer, and the blue emission layer in a display device may be formed by a vacuum deposition method using a deposition mask. However, in the vacuum deposition method emission layers with two colors may overlap according to an alignment state of a substrate and a deposition mask, so that colors are mixed. For example, when the deposition mask is distorted or a distance between the substrate and the deposition mask is increased, while the red emission layer is formed after the blue emission layer and the green emission layer are formed, the red emission layer may overlap another emission layer. Accordingly, the vacuum deposition method has a technical limit in manufacturing an organic light emitting diode display having high resolution.

Further, the organic light emitting diode is very vulnerable to moisture. In a conventional organic light emitting diode display, in which the organic light emitting diode is spaced apart from an encapsulation substrate, a sheet-type moisture absorbent may be disposed in a dead space at an outer side of a display area or a transparent moisture absorbent may be disposed in an internal surface of the encapsulation substrate. However, it is difficult to dispose a moisture absorbent in an organic light emitting diode display in which an organic light emitting diode is directly covered by thin film encapsulation, an encapsulation film, or the like.

In contrast, in the organic light emitting diode display according to example embodiments, mixing of colors during deposition is prevented, thereby simplifying manufacturing and improving high resolution. That is, there is no concern that colors are mixed, and pitches of the all of the pixels are very small, thereby implementing a screen with high resolution. Further, the organic light emitting diode display according to example embodiments includes a moisture absorbent inside a film-type organic light emitting diode display, thereby avoiding expansion of a dead space and maximally restricting deterioration of an organic light emitting diode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
   a substrate including at least one folding part;
   two or more emission units parallel to each other and on a same surface of the substrate in an unfolded state of the substrate, the two or more emission units overlapping each other in a folded state of the substrate; and
   a moisture absorbent on an inner surface of the folding part, the moisture absorbent being positioned between the two or more emission units in the unfolded state of the substrate.

2. The organic light emitting diode display as claimed in claim 1, wherein the moisture absorbent includes at least two moisture absorbents.

3. The organic light emitting diode display as claimed in claim 1, wherein the two or more emission units include a plurality of pixels, the plurality of pixels being arranged to be offset from each other in a surface direction of the substrate in the folded state of the substrate.

4. The organic light emitting diode display as claimed in claim 3, wherein a first emission unit of the two or more emission units is a bottom emission type, and at least a second emission unit of the two or more emission units is a top emission type.

5. The organic light emitting diode display as claimed in claim 1, wherein the moisture absorbent is on a same surface as the two or more emission units in the unfolded state of the substrate.

6. The organic light emitting diode display as claimed in claim 1, wherein the moisture absorbent does not overlap tops of the two or more emission units in the folded state of the substrate.

7. The organic light emitting diode display as claimed in claim 1, wherein an overlap area of the two or more emission units defines a display area, the moisture absorbent being external with respect to the display area.

8. The organic light emitting diode display as claimed in claim 1, wherein the moisture absorbent is horizontally spaced apart from each of the two or more emission units in the folded state of the substrate.

9. An organic light emitting diode display, comprising:
   a substrate including a first area and a second area connected to each other by a folding part;
   a first emission unit in the first area and including first pixels;
   a second emission unit in the second area and including second pixels, the second area facing the first emission unit in a folded state of the substrate;
   a moisture absorbent on an inner surface of the folding part; and
   a sealant to seal the first emission unit and the second emission unit, wherein the first pixels and the second pixels are offset from each other in a surface direction of the substrate in the folded state of the substrate,
   wherein each of the first pixels and the second pixels includes a plurality of pixels arranged at a first pitch, and
   wherein a pixel pitch of a display surface of the first pixels and the second pixels in the folded state of the substrate is smaller than the first pitch.

10. The organic light emitting diode display as claimed in claim 9, wherein:
    the plurality of pixels includes a red pixel, a green pixel, and a blue pixel.

11. The organic light emitting diode display as claimed in claim 10, wherein an arrangement order of the first pixels in one direction of the display surface in an unfolded state of the substrate is different from an arrangement order of the second pixels.

12. The organic light emitting diode display as claimed in claim 10, wherein:
    each of the first pixels includes a transparent first pixel electrode, a first emission layer, and a metal first common electrode, and
    in the first emission unit, the first common electrode includes a plurality of electrode units and a wiring unit for connecting the plurality of electrode units.

13. The organic light emitting diode display as claimed in claim 12, wherein each of the second pixels includes a metal second pixel electrode, a second emission layer, and a transparent second common electrode.

14. The organic light emitting diode display as claimed in claim 9, wherein the moisture absorbent includes at least two moisture absorbents.

15. An organic light emitting diode display, comprising:
    a substrate including a third area, a fourth area connected to a first side of the third area by a first folding part, and a fifth area connected to a second side of the third area by a second folding part;
    a third emission unit in the third area and including third pixels;
    a fourth emission unit in the fourth area and including fourth pixels;
    a fifth emission unit in the fifth area and including fifth pixels;
    moisture absorbents on internal surfaces of the first folding part and the second folding part; and
    a sealant to seal the third to fifth emission units,
    wherein the third emission unit, the fourth emission unit, and the fifth emission unit overlap each other in a folded state of the substrate, and the third pixels, the fourth pixels, and the fifth pixels are offset from each other in a surface direction of the substrate in a folded state of the substrate, and
    wherein each of the moisture absorbents is outside an overlap area of the third through fifth emission units.

16. The organic light emitting diode display as claimed in claim 15, wherein each of the third pixels, the fourth pixels, and the fifth pixels includes a red pixel, a green pixel, and a blue pixel.

17. The organic light emitting diode display as claimed in claim 16, wherein:
    each of the third pixels, the fourth pixels, and the fifth pixels includes an emission layer of a single color arranged at a second pitch, and
    a pixel pitch of a display surface defined by the third pixels, the fourth pixels, and the fifth pixels is ⅓ of the second pitch.

18. The organic light emitting diode display as claimed in claim 17, wherein:
    each of the third pixels includes a transparent third pixel electrode, a third emission layer, and a metal third common electrode, and
    in the third emission unit, the metal third common electrode includes a plurality of electrode units and a wiring unit for connecting the plurality of electrode units.

19. The organic light emitting diode display as claimed in claim 18, wherein:

each of the fourth pixels includes a metal fourth pixel electrode, a fourth emission layer, and a transparent fourth common electrode, and each of the fifth pixels includes a metal fifth pixel electrode, a fifth emission layer, and a transparent fifth common electrode.

20. The organic light emitting diode display as claimed in claim 15, wherein the moisture absorbents include at least two moisture absorbents at each side of two opposite sides of the overlap area of the third through fifth emission units.

* * * * *